(12) United States Patent
Hayakawa

(10) Patent No.: US 8,721,358 B2
(45) Date of Patent: May 13, 2014

(54) SOCKET FOR ELECTRIC PARTS

(71) Applicant: Enplas Corporation, Kawaguchi (JP)

(72) Inventor: Kenji Hayakawa, Kawaguchi (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 13/713,303

(22) Filed: Dec. 13, 2012

(65) Prior Publication Data

US 2013/0171861 A1     Jul. 4, 2013

(30) Foreign Application Priority Data

Dec. 28, 2011   (JP) .................................. 2011-288139

(51) Int. Cl.
*H01R 13/62*     (2006.01)
(52) U.S. Cl.
USPC ......................................................... 439/372
(58) Field of Classification Search
USPC ......... 439/372, 330–331, 342, 263–264, 266, 439/268, 269.1, 70–73, 526
See application file for complete search history.

(56) References Cited

U.S. PATENT DOCUMENTS

| 7,914,295 B2 * | 3/2011 | Nakamura et al. | 439/66 |
| 2006/0094280 A1 * | 5/2006 | Hayakawa | 439/331 |
| 2008/0293279 A1 * | 11/2008 | Chen | 439/268 |

FOREIGN PATENT DOCUMENTS

JP      2007-59117      3/2007

* cited by examiner

*Primary Examiner* — Edwin A. Leon
(74) *Attorney, Agent, or Firm* — Staas & Halsey LLP

(57) ABSTRACT

A socket for electric parts which is dawn sized. The socket of the present invention has a socket body, contact pins to conduct to an electric part, a latch rotatably located on the socket body so as to positioned above the contact pins, which presses the electric part when the latch is closed and is in a state the electric part can be accommodated and taken out when the latch is opened, and an operating member vertically movably disposed in the socket body and has an operating portion for opening constituted so as to press down an operation portion to be operated for opening formed to the latch and rotate the latch in an opening direction when the operating member descends. An outermost position of the latch is disposed on an inside of outermost portion of the contact pins when the latch is opened to an outermost position.

4 Claims, 15 Drawing Sheets

(a)

(b)

SOCKET FOR ELECTRIC PARTS

BACKGROUND OF THE INVENTION

1. Field of the Invention

The present invention relates to a socket for electric parts disposed on a circuit board and adapted to accommodate electric parts for carrying out a performance test or like of the electric parts such as semiconductor device (called "IC package" hereinafter).

2. Description of the Prior Art

As such a socket for electric parts of the kind mentioned above, there is conventionally known an IC socket used for performing a test for an IC package as disclosed, for example, in Japanese Patent Application Laid-open No. 2007-59117.

This IC socket comprises a socket body which is located on a circuit board and accommodates an IC package. Furthermore, the IC socket comprises a rotatably supported latches for pressing down the accommodated IC package, and an operating member, which is used for rotating the latches, is constituted so that it may vertically moves relatively to the socket body.

When opening the latch, the operating member is made to descend, and so the latch is released from a state locked by the operating member. Then, the latches rotate in a direction to be opened, because the canter of gravity of the latches are set outer side of rotation axes of the latches themselves. As a result, the latches are opened to outermost position and are taken refuge in a outer side of the area where the IC package is accommodated and taken out.

When closing the latch, the operating member is made to rise, and so the top portions of stopper walls of the operating member contact with a lower faces of the operated portions of the latches and push up the latches. As a result, the lathes rotate themselves in a direction to be closed.

When the latches are closed, the IC package is pushed by pushing portions of the latches, and so contact pins and the IC package contact each other at predetermined contact pressure.

In such a conventional IC socket, the canter of gravity of the latches are necessarily to be set outer side from rotation axes of the latches themselves. For this reason, outer side edges of the latches extend to outer side, and the operating member for making the latches move vertically is necessarily to be placed outer side of the latches. Such a constitution make it difficult to downsize the IC socket.

SUMMARY OF THE INVENTION

An object of the present invention is to provide a socket for electric parts which is down sized in comparison with the conventional socket for electric parts.

In order to achieve the object mentioned above, the present invention provides a socket for electric parts comprising: a socket body which has a rectangle shape and has an accommodation surface to accommodate an electric parts having a rectangle shape and a lower surface to which terminals are provided; plural contact pins of horseshoe-shapes, which are disposed in parallel and at predetermined intervals to a peripheral edge of the socket body, and each of which has an elastic piece to contact with the terminals of the electric part; a latch rotatably disposed on the socket body so as to positioned above the contact pins, which presses an upper part of peripheral portion of the electric part when the latch is closed and is in a state the electric part is able to be accommodated onto and taken out from the accommodation surface when the latch is opened; an operating member which is vertically movably disposed in the socket body, and comprises an operating portion for opening constituted so as to press down an operation portion to be operated for opening of the latch and rotate the latch in an opening direction when the operating member moves downward; wherein a most outside position of the latch is disposed on an inside of most outside portion of the contact pins when the latch is opened to an outermost position.

Another characteristic feature of the present invention may reside in that the most outside position of the latch is defined by the operation portion to be operated for opening.

Another characteristic feature of the present invention may reside in that the rotation shaft of the latch is positioned below the accommodation surface of the socket body.

Another characteristic feature of the present invention may reside in that the operation portion to be operated for opening formed at a rear end side of the latch has a surface which faces the contact pins and curves along the curved-shape of the contact pins.

According to the present invention, since the most outside position of the latch is disposed on an inside of most outside portion of the contact pins when the latch is opened to an outermost position, in comparison with the conventional art, the latch does not largely project out into outside, and so the present invention can realize a compact outer configuration of the socket for electric parts. Furthermore, according to the present invention, the rotation axis of the latch can be disposed near the center of the socket body without losing the stroke between the rotation axis of the latch and a pressing portion for pressing the electric part, and so, in this point, too, the present invention can realize a compact outer configuration of the socket for electric parts.

According to another characteristic feature of the present invention, since the most outside position of the latch is defined by the operation portion to be operated for opening, it becomes possible to realize a compact outer configuration of the socket for electric parts.

According to another characteristic feature of the present invention, since the rotation axis of the latch is disposed below the accommodation surface of the socket body, it become possible to allocate an enough long stroke between the latch and the accommodation surface. Therefore, the present invention can use the pressing portion to execute pressing and releasing of the electric part in spite of a low rotation angle of the latch. As a result, the present invention can make a vertical stroke of the operating member, and so, can make a vertical stroke of the socket for electric part. In this point, too, the present invention can realize a compact outer configuration of the socket for electric parts. Additionally, the present invention can make a moving distance of the latch toward outside shorten, and so the present invention can realize a compact outer configuration of the socket for electric parts.

According to another characteristic feature of the present invention, since the surface, which is formed at the operation portion to be operated for opening of a rear end side of the latch and is facing the contact pins, is curved along the curved-shape of the contact pins, it becomes possible that the rear end extends along the curved-shape of the contact pins when the latch opens. As a result, the present invention can improve a strength of the rear end of the latch by effectively using a space between the curve-shaped portion of the contact pins and the rear end of the latch.

BRIEF DESCRIPTION OF THE DRAWINGS

Other objects and purposes of the present invention are described with referencing following attached drawings.

DETAILED DESCRIPTION

Figure 1:
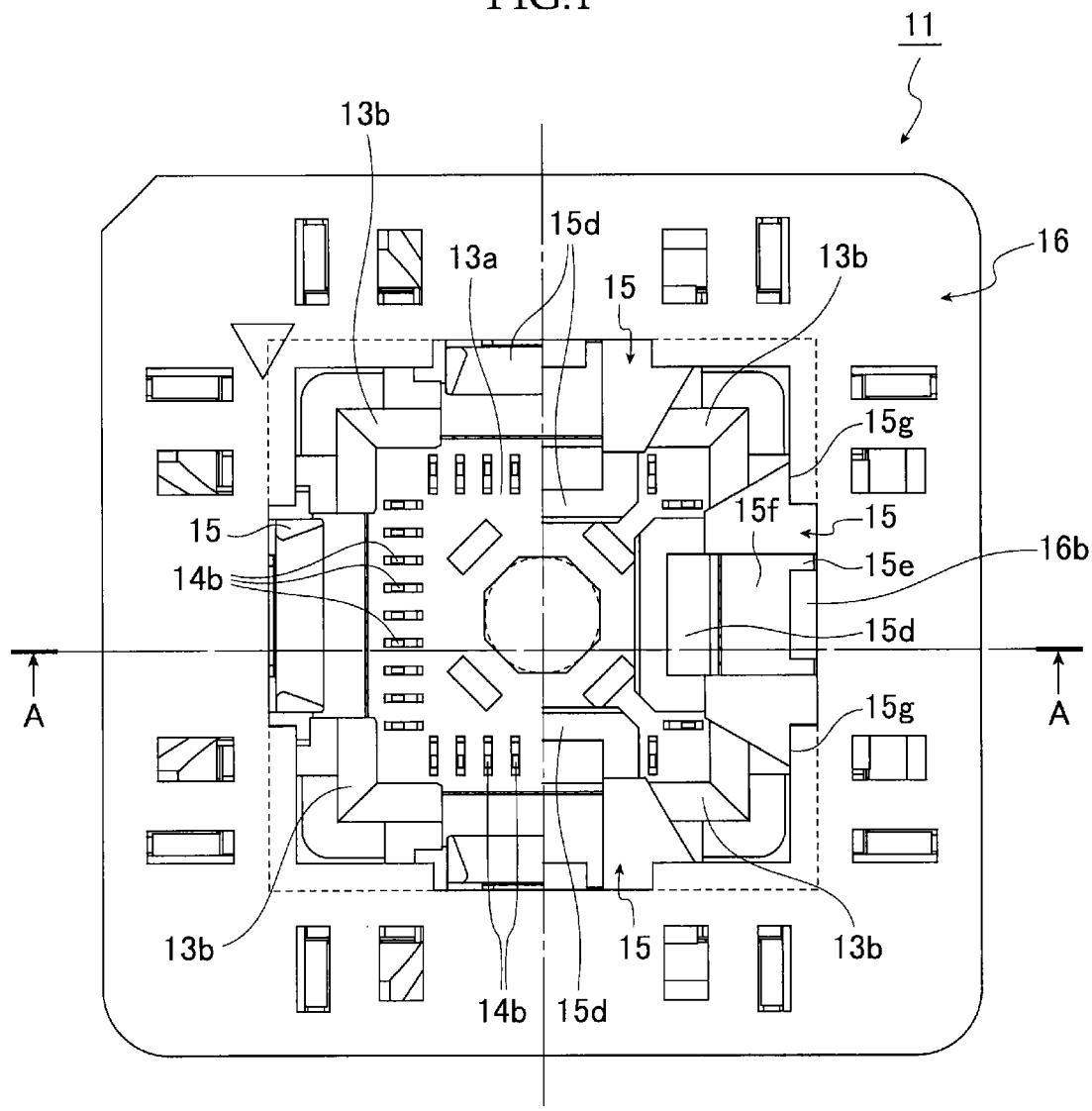
FIG. 1 is a plan view of an IC socket according to an embodiment of the present invention.

Hereunder, an embodiment of the present invention will be described.

FIGS. 1 to 15 represent one embodiment of the present invention. Structure or configuration of the present embodiment will be first described hereunder, in which reference numeral 11 denotes an IC socket as "socket for electric parts", and the IC socket 11 is disposed on a circuit board, not shown, and is a component for establishing an electric connection between terminals 12b of an IC package 12 as the "electric parts" and the circuit board for the purpose of performing burn-in test or like of the IC package and the like.

Figure 15:
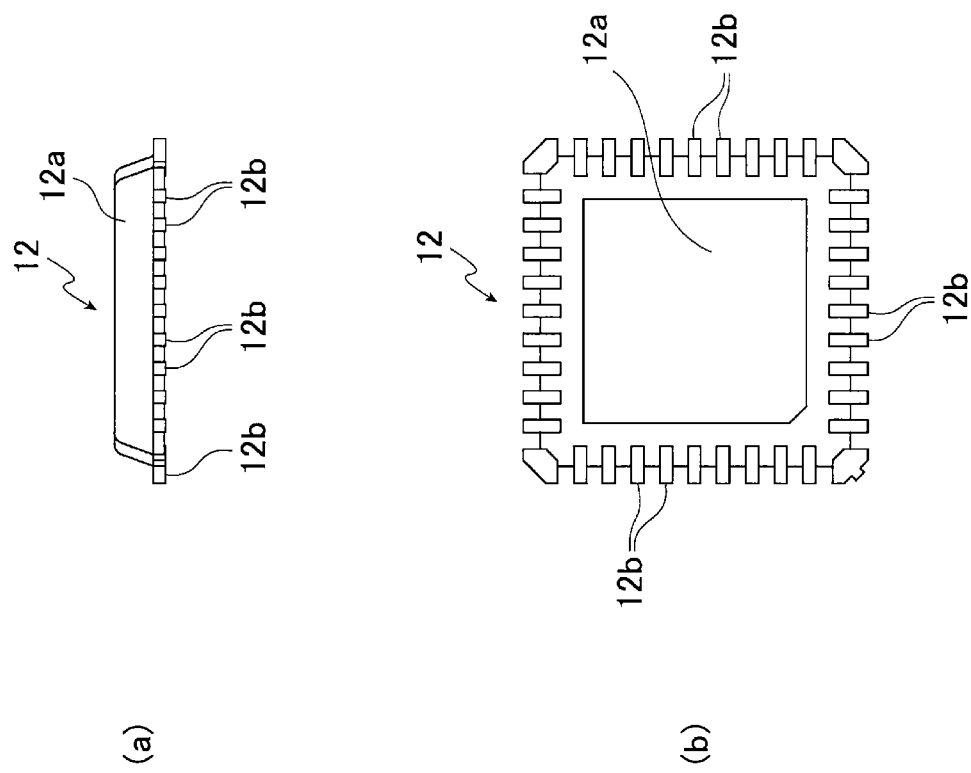
FIG. 15 illustrates the IC package and includes (a) being a front view of the IC package and (b) being a bottom view of the IC package.

The IC package 12 has a package body 12a having a rectangular shape in a plan view as shown in FIG. 15, and a plurality of terminals 12b are disposed to four sides of the lower surface of the peripheral edge of the package body 12b.

Figure 2:
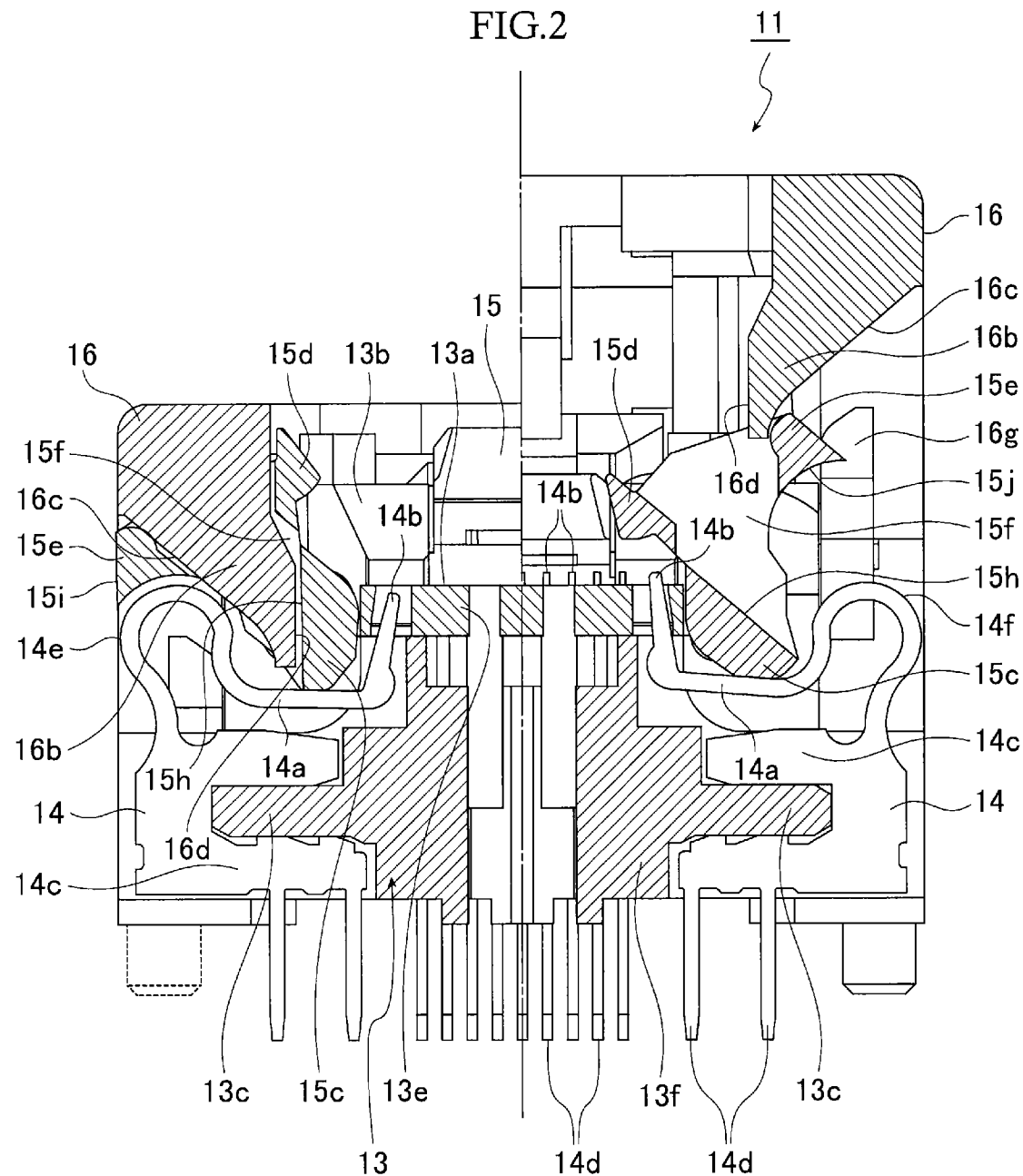
FIG. 2 is a sectional view taken along the line A-A in FIG. 1 according to the embodiment.
Figure 3:
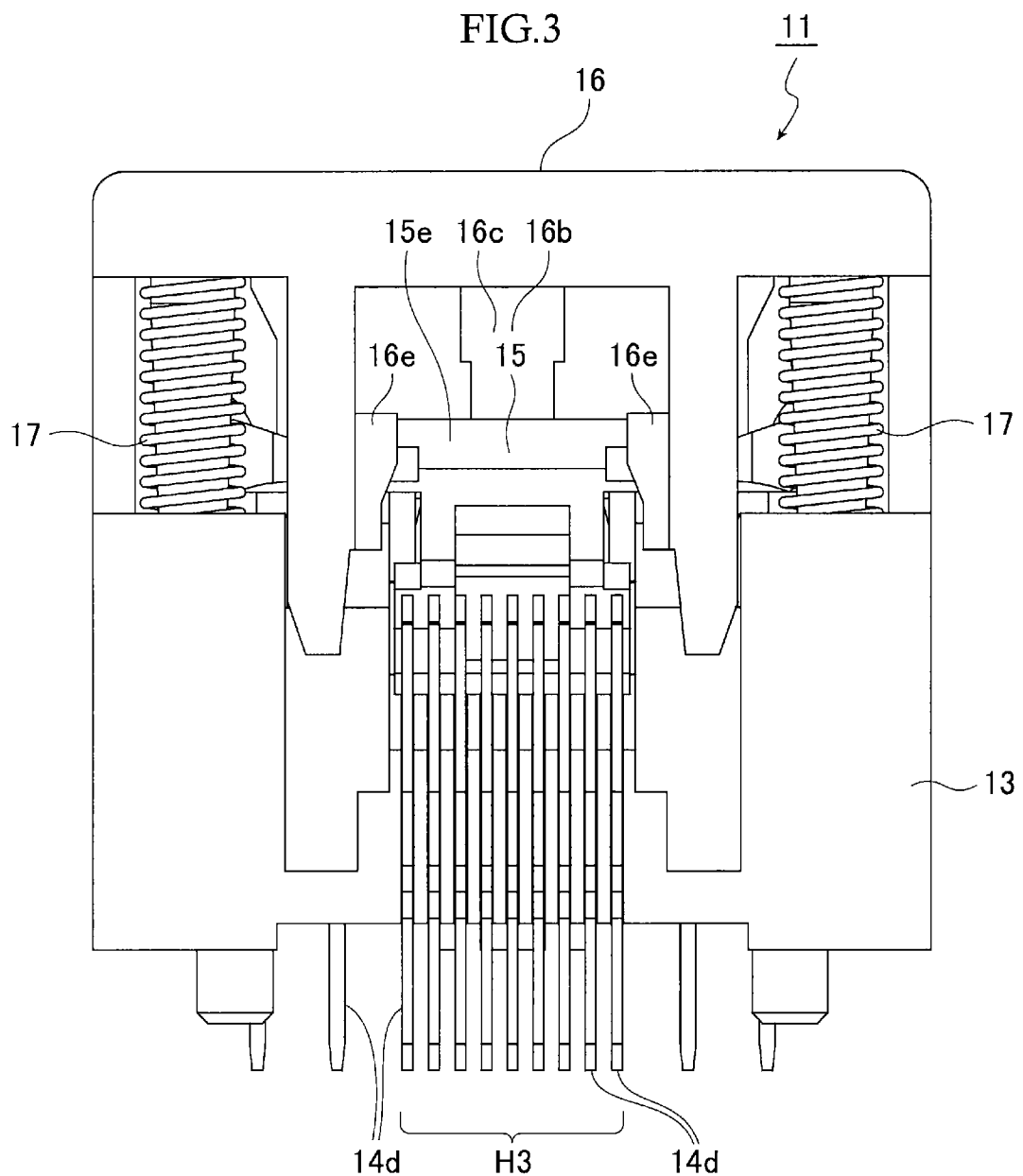
FIG. 3 is a view of the IC socket as viewed from the right side in FIG. 1.

On the other hand, the IC socket 11 is provided with, as shown in FIGS. 1 and 2, a socket body 13 having an accommodation surface portion 13a on which the IC package 12 is accommodated, contact pins 14 provided for the socket body 13 and having elastic pieces 14a formed with contact portions 14b contacting terminals 12b of the IC package 12, latches 15 pressing the IC package 12, from the upper side thereof, accommodated in the socket body 13 to be vertically movable, and an operating member 16 provided for the socket body 13 to be vertically movable. When the operating member 16 is operated to be moved downward, the latches 15 are rotated (pivoted) in an opening direction, and on the other hand, when the operating member 16 is moved upward, the larches 15 are rotated in a closing direction.

Figure 8:
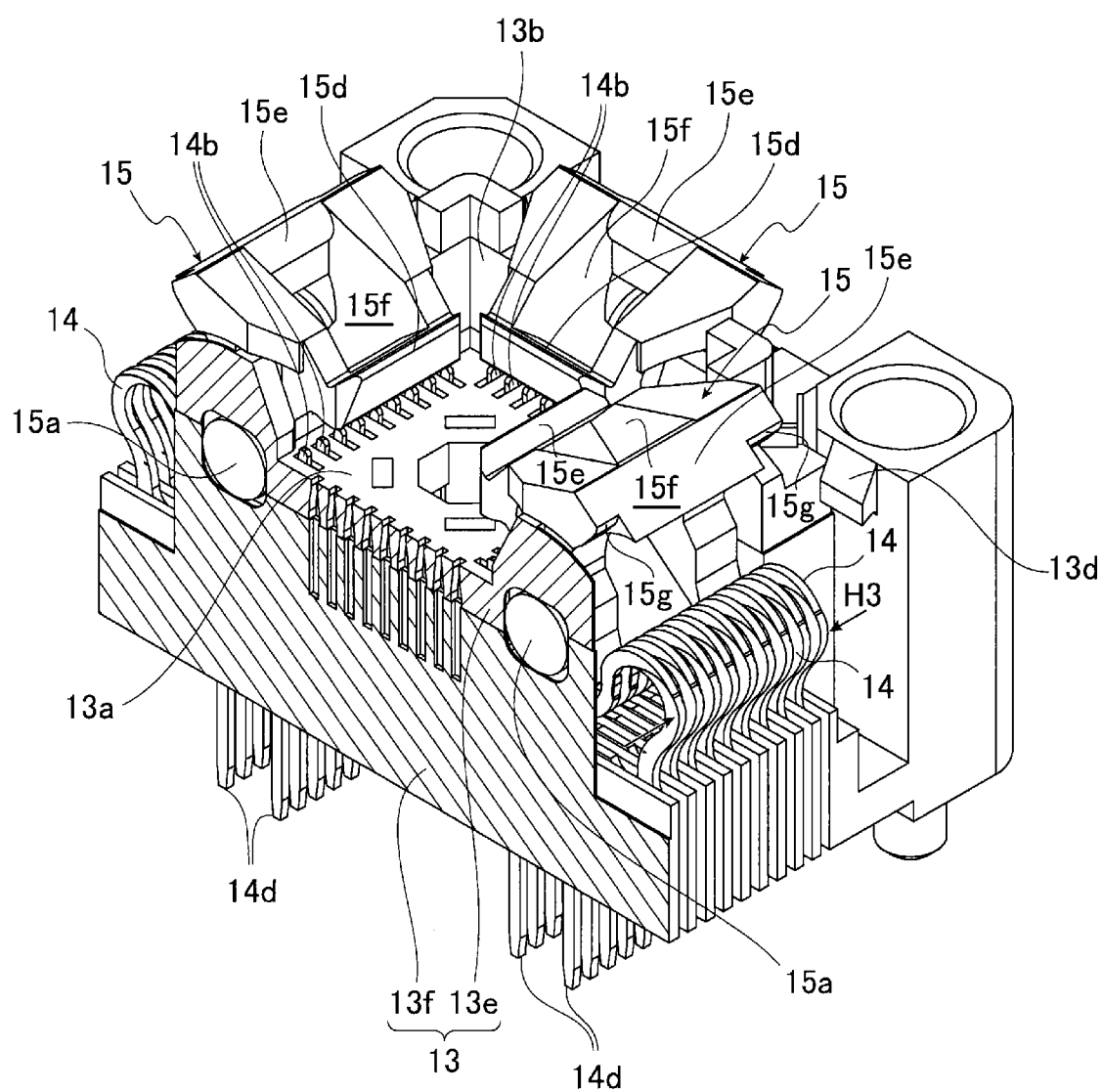
FIG. 8 is a perspective view of the IC socket, partially cut away, showing a state in which the operating member of the IC socket according to the present embodiment is removed.

The socket body 13 is formed of an insulated synthetic resin material, and as shown, for example, in FIG. 1 and FIG. 8, composed of an upper side member 13e and a lower side member 13f. The upper side member 13e has an upper surface portion formed with the accommodation surface portion 13a having peripheral four corner portions to which guide portions 13b for guiding the IC package 12 when accommodated are formed so as to project upward. On the other hand, the lower side member 13f of the socket body 13 provided with mount portions 13c so as to project in four directions as shown in FIG. 2, for example, and a plurality of contact pins 14 are attached to the mount portions 13c to be detachable from the horizontal side.

Further, each of the contact pins 14 is formed of a metal material having conductivity in so-called horseshoe-shape, and as shown in FIG. 2, each of the contact pin 14 has a clamp portion 14c so as to clamp the mount portion 13c, projecting horizontally from the socket body 13, from the vertical sides thereof to be detachable. According to such structure, the contact pin 14 is detachably mounted to the mount portion 13c of the socket body 13 from the side direction.

Furthermore, as shown in FIG. 2, each of the contact pin 14 has a structure in which the elastic piece 14a extends upward from the outer side end portion of the mount portion 13c, and then bent inward so as to substantially horizontally extend, and the contact portion 14b is formed so as to extend upward from the front end portion of the elastic piece 14a in a manner such that the contact portion 14b contacts a corresponding terminals 12b of the IC package 12. The contact pins 14 are provided with lead portions 14d extending downward from the clamp portions 14c thereof, and the lead portions 14d are inserted into the circuit board, not shown, and then are soldered to be fixed thereto.

In this way, plural contact pins 14 are arranged at four side portions of the peripheral edge of the socket body 13 to be in parallel with each other and adjacently at a predetermined pitch.

Figure 9:
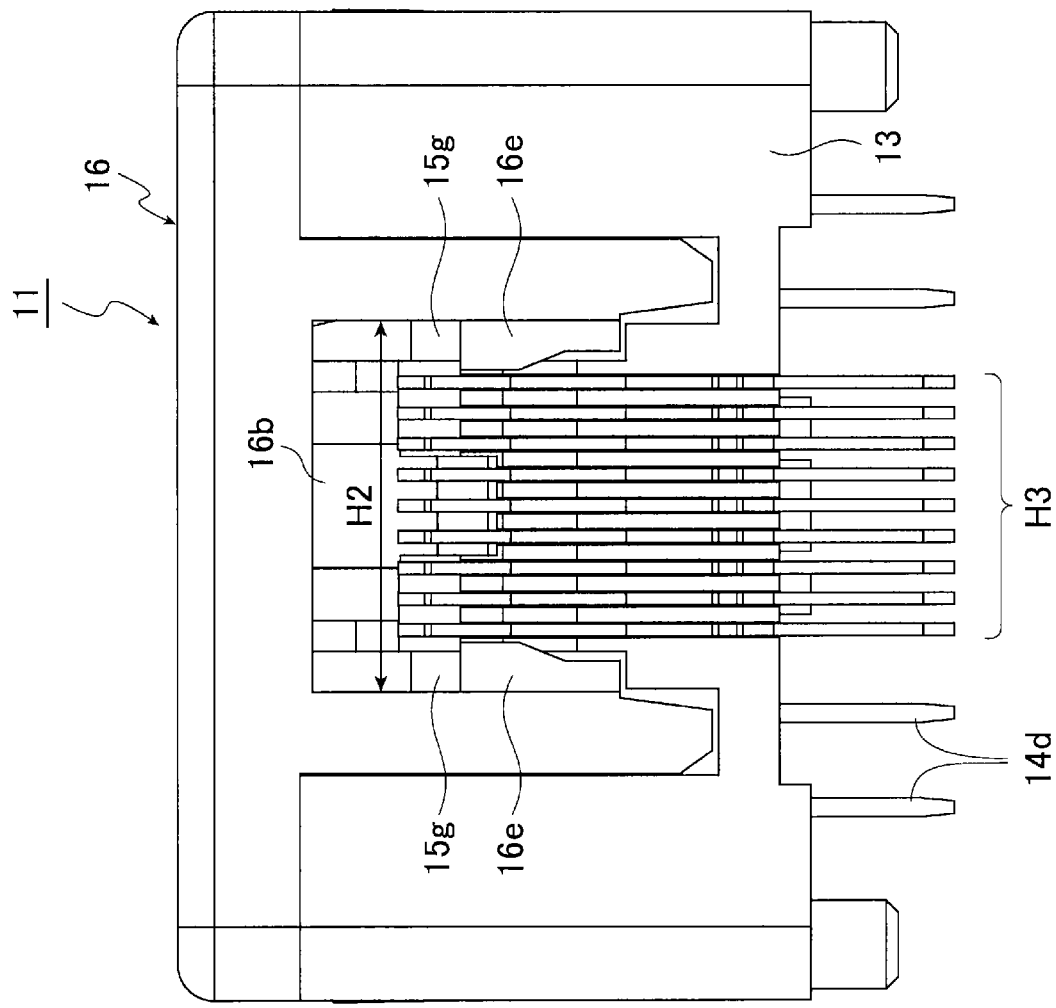
FIG. 9 is a side view of the IC socket showing a state in which the operating member of the IC socket of the present embodiment takes a descending lowermost position thereof.

As shown in FIG. 9, the latches 15 are arranged at four portions with respect to the respective sides of the IC package 12 and positioned above the plural contact pins 14 to be rotatable with respect to the socket body 13. In an operation, when the latches 15 are in closed state, the upper portion of the peripheral edge portion of the IC package 12 is pressed, and when the latches 15 are in opened state, the IC package 12 can be accommodated into or taken out of the accommodation surface portion 13a of the socket body 13.

Figure 10:
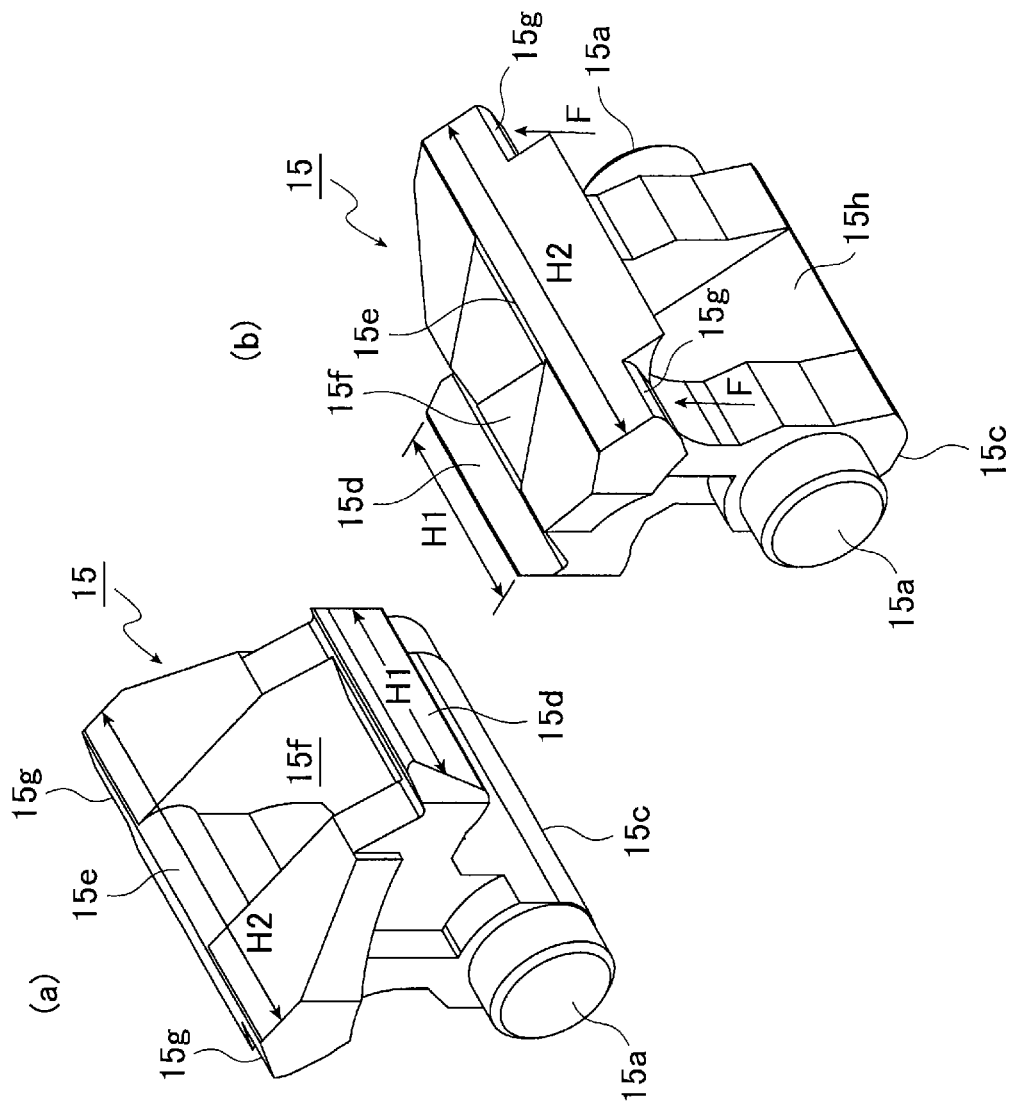
FIG. 10 includes perspective views (a) and (b) showing a latch of the IC socket according to the present embodiment, both being viewed from different directions.

More specifically, as shown in FIG. 10 or others in a plan view, each of the latch 15 has a front end side portion having a narrow width H1 and a rear end side portion having a wide width H2, thus providing a trapezoid shape. An opening 15f is formed to a central portion of the trapezoid portion. Rotation (rotating) shafts 15a are located to the front end side of the latches 15 so as to project in both side directions, and as shown in FIG. 8, both side rotation shafts 15a are clamped and held between the upper side member 13e and the lower side member 13f to be rotatable. The rotation shafts 15a (fulcrum) are positioned below the IC package accommodation surface portion 13a of the socket body 13.

Furthermore, each of the latches 15 is formed with a cam portion 15c between a pair of rotation shafts 15a located on both sides on the same axis, and as shown in FIG. 2 showing the left-half side of the latch 15, when the latch 15 is rotated in the opening direction, the elastic piece 14a of the contact pin 14 is pressed by the cam portion 15c and is hence elastically deformed downward, the contact portion 14b is displaced downward so as to be separated in the downward direction from the contacting portion to the terminal 12b of the IC package 12. Likely, as shown in FIG. 2 showing the right-half side of the latch 15 and FIG. 6, when the latch 15 is rotated in the closing direction, the pressing force of the cam portion 15c to the elastic piece 14a is released and the contact portion 14b is displaced upward by the elastic force of the elastic piece 14a to thereby move the contact portion 14b to the contacting portion of the terminal 12b of the IC package 12.

On an opposite side to the cam portion 15c, an inclined surface portion 15h for escape is formed on an extension of the axis of the rotation shaft 15a, and according to such formation of the inclined surface portion 15h, the sectional area of the cam portion 15c is made smaller than that of the rotation shaft 15a on each of both sides of the latch 15.

Moreover, as shown in FIGS. 2 and 10, for example, the latch 15 is provided with the pressing portion 15d (fulcrum point) pressing the upper surface of the IC package 12, and in addition, an operation portion 15e (point of effort) to be operated for opening which is pressed downward at a descending time of the operating member 16. When the operation portion 15e to be operated for opening is pressed downward, the latch 15 is rotated in the opening direction.

The operation portion 15e to be operated for opening is formed at substantially the central portion on the rear end side, at which the width H2 of the latch 15 is widened, and on the outer edge side of the opening 15f.

As shown in FIG. 2, a part of the rear end portion of the latch 15, at which the operation portion 15e to be operated for opening is formed, has a surface 15j facing the contact pins 14. The surface 15j curves along the curved-shape portions 14f of the contact pins 14. Therefore, when the latch 15 is opened, the part of which the operation portion 15e to be operated for opening is formed become in parallel with the curved-shape portions 14f of the contact pins 14. As a result, a strength of the rear end of the latch 15 can be improved by effectively using a space between the curve-shaped portion 14f of the contact pins 14 and the surface 15j of the latch 15.

Furthermore, a pair of operation portions 15g (points of effort) to be operated for closing are formed so as to project sideway at both end portions of the rear end side at which the width H2 of the latch is widened (see FIG. 10). The paired operation portions 15g to be operated for closing are formed so as to project sideway near the outer sides of the arrangement range width H3 of the contact pins 14 arranged, and according to this arrangement, a distance H2 between both operation portions 15g to be operated for closing is widened more than the arrangement range width H3 (for example, see FIG. 9).

Figure 11:
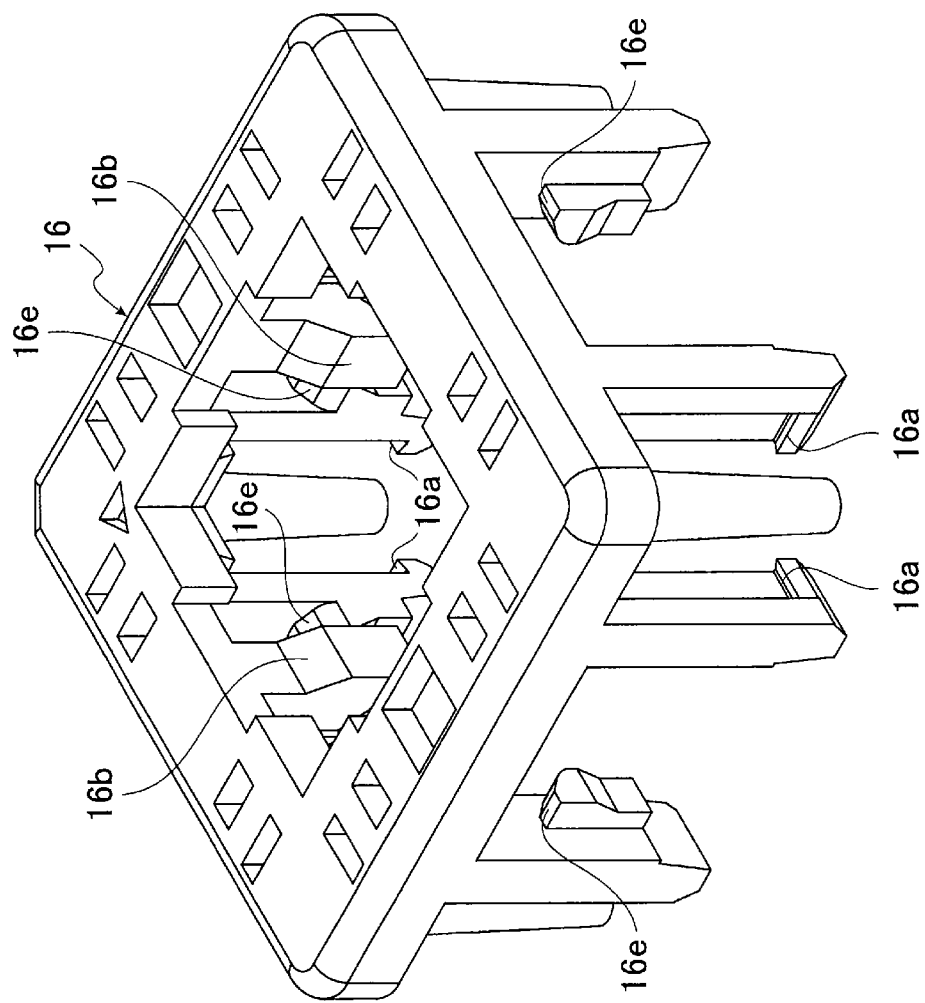
FIG. 11 is a perspective view showing the operating member of the IC socket according to the present embodiment.
Figure 12:
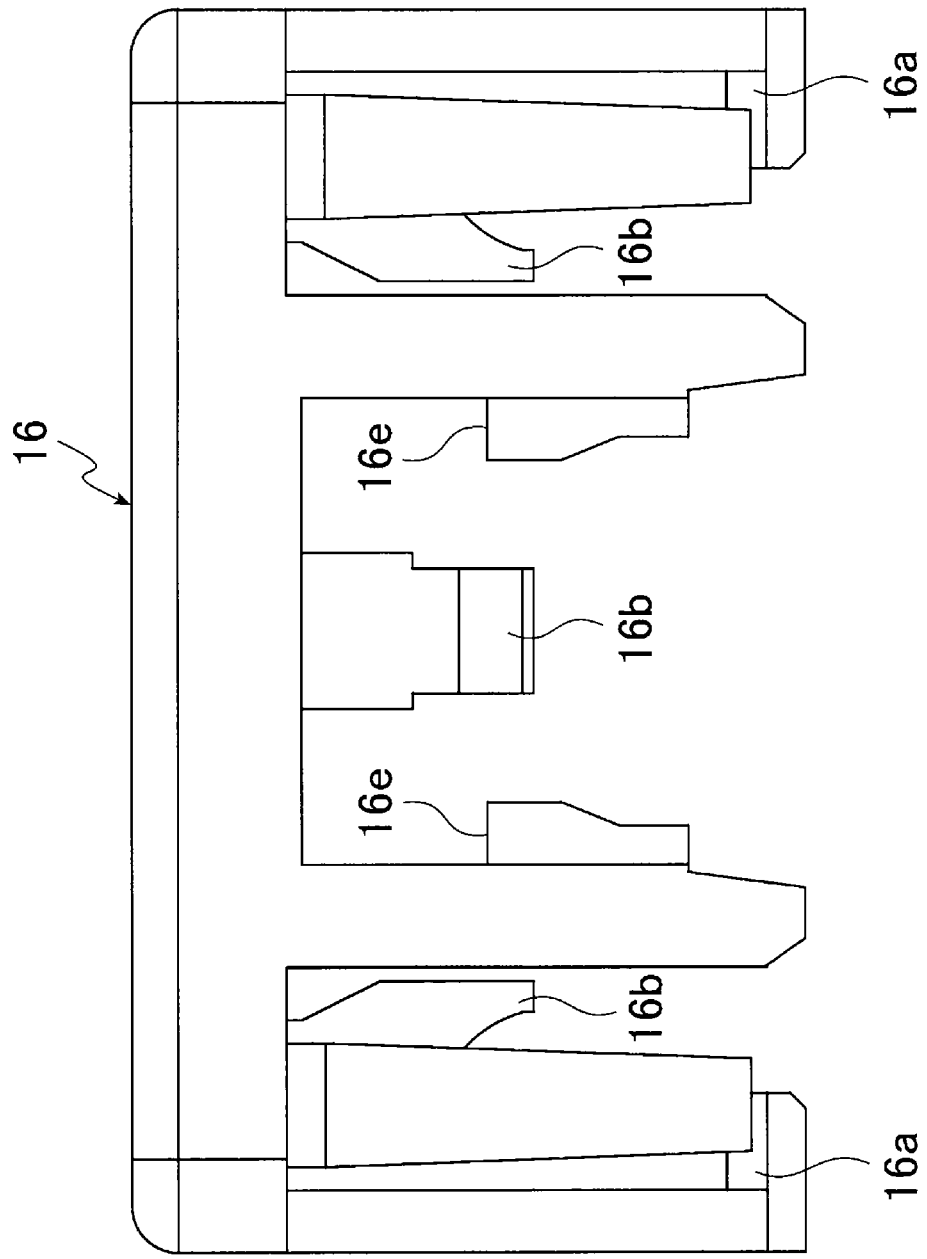
FIG. 12 is a side view showing the operating member of the IC socket according to the present embodiment.
Figure 13:
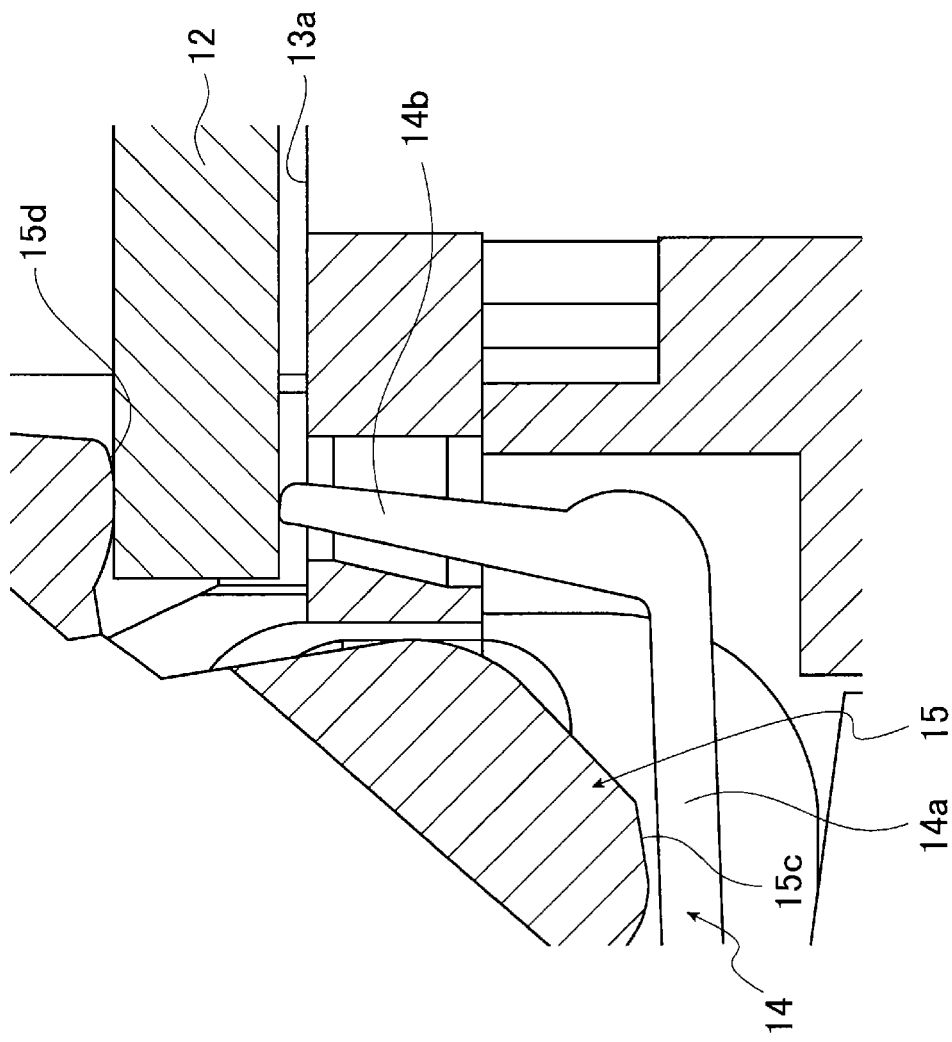
FIG. 13 is a sectional view, in an enlarged scale, showing a state in which the IC package accommodated in the IC socket is slightly pushed upward by a contact pin of the IC socket according to the present embodiment.

Still furthermore, the operating member 16 has a frame-shaped structure in a plan view and is provided for the socket body 13 to be vertically movable. The operating member 16 is urged upward (see FIG. 3) by springs 17 which are disposed at four positions, and, at the uppermost position, an engaging portion 16a shown in FIG. 11 is engaged with a portion 13d to be engaged (engagement portion 13d shown in FIG. 7) formed to the socket body 13 to thereby restrict the upward movement of the operating member 16.

Furthermore, the operating member 16 is provided with the operating portion 16b for opening which rotates the latch 15 in the opening direction thereof in engagement with the operation portion 15e to be operated for opening formed to the central portion in the width direction of the latch 15 when the operating member 16 is moved downward from the uppermost position thereof, that is, the operating member 16 is moved from the state shown in right-half state in FIG. 2 to the left-half state therein. The operating portion 16b for opening is provided for the operating member 16 so as to extend in an extending direction toward the obliquely downward inside the socket body 13.

The operating portion 16b for opening comprises a slide surface 16c linearly formed so as to presses and slides the operation portion 15e to be operated for opening of the latch 15 as shown in FIG. 2, for example. The operating portion 16b for opening is formed so as to, when the operating portion 16b for opening of the opening member 16 is moved downward, the operating portion 16b is inserted into the opening portion 15f while pressing downward a operation portion 15g to be operated for closing of the latch 15.

In the state where the operating member 16 is moved downward to the descending lowermost position and the latch 15 is fully opened, it is set that the front end of the operating portion 16b for opening is inserted into the opening 15f to a position on an extension axis line of the rotation shaft 15a, and a front end surface 16d along the perpendicular direction of the operating portion 16b for opening approximately abuts against the inclined surface portion 15h for escape of the latch 15.

Figure 4:
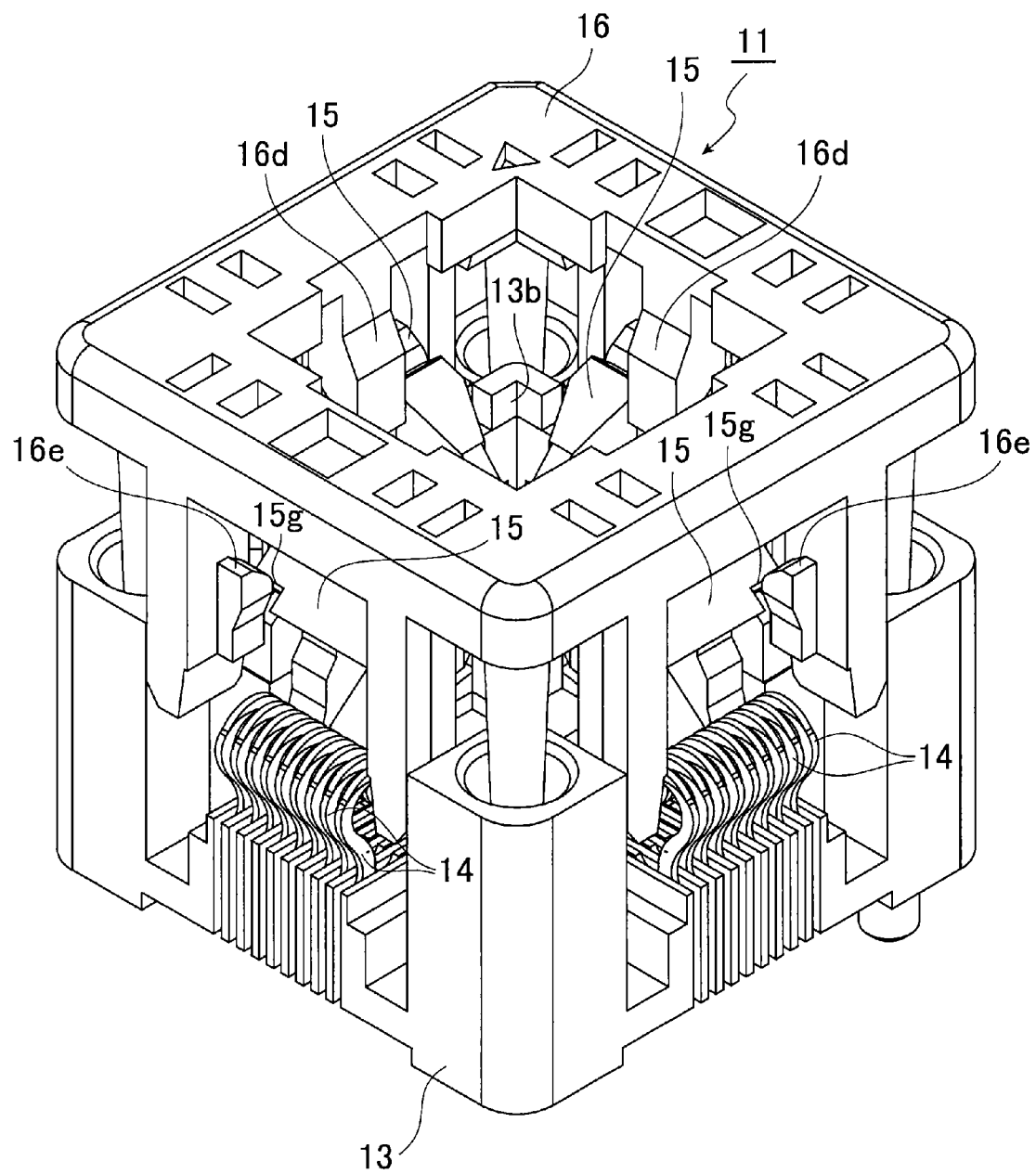
FIG. 4 is a perspective view of the IC socket showing a state in which an operating member of the IC socket of the present embodiment takes an ascending uppermost position thereof.
Figure 5:
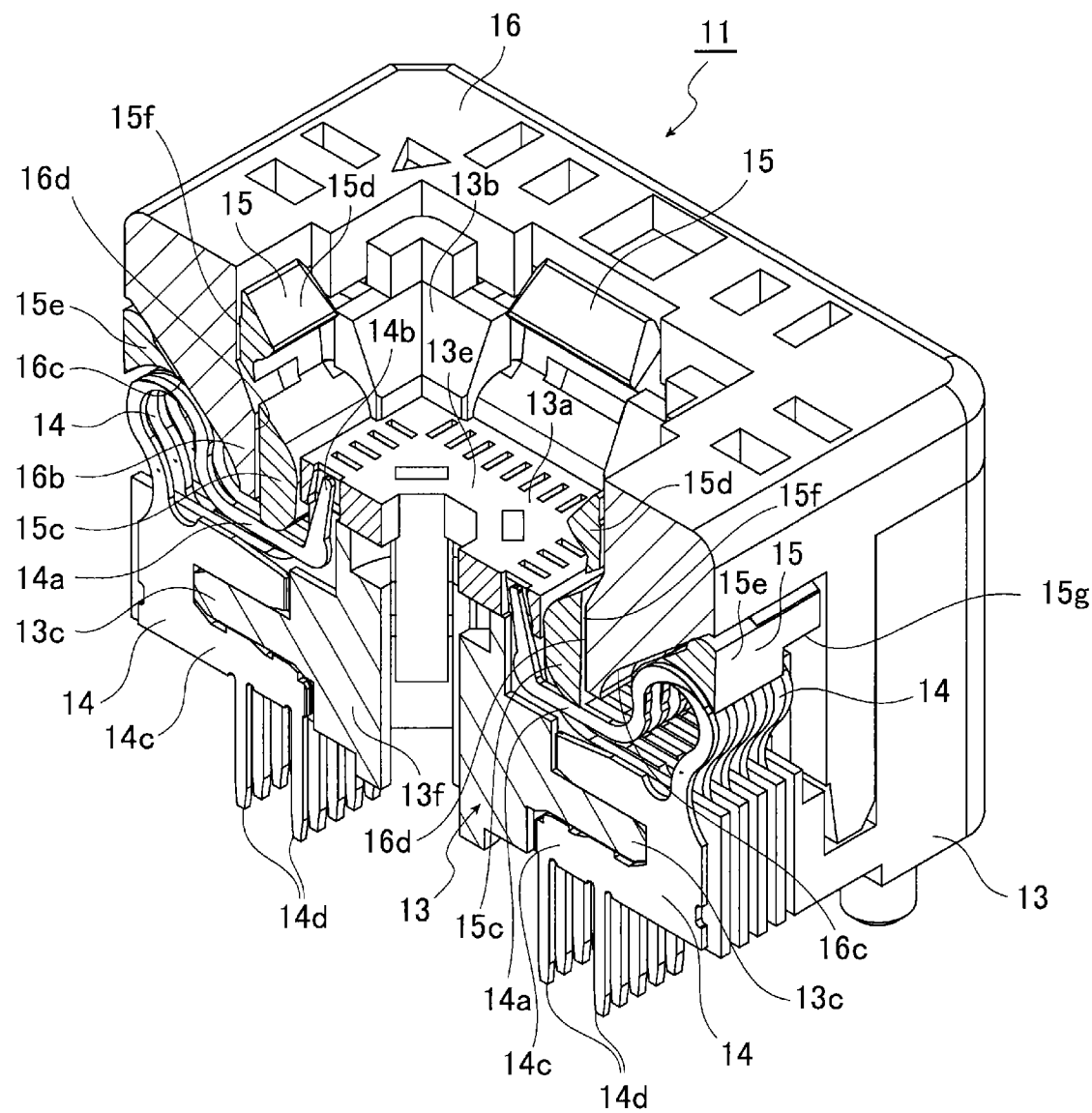
FIG. 5 is a perspective view of the IC socket, partially cut away, showing a state in which the operating member of the IC socket of the present embodiment takes a descending lowermost position thereof.
Figure 6:
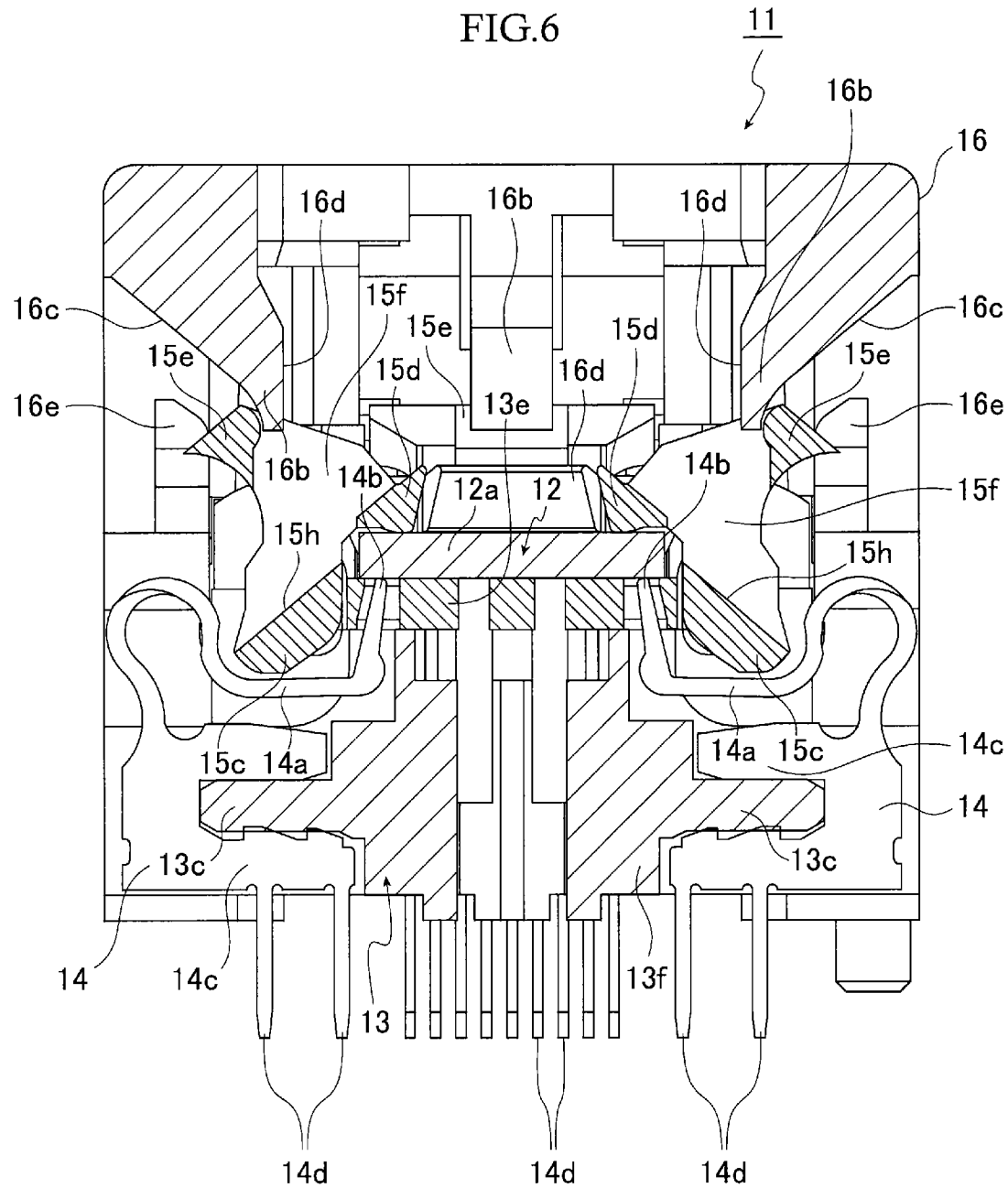
FIG. 6 is a sectional view of the IC socket showing a state in which an IC socket of the IC package of the present embodiment is accommodated in a socket body.
Figure 7:
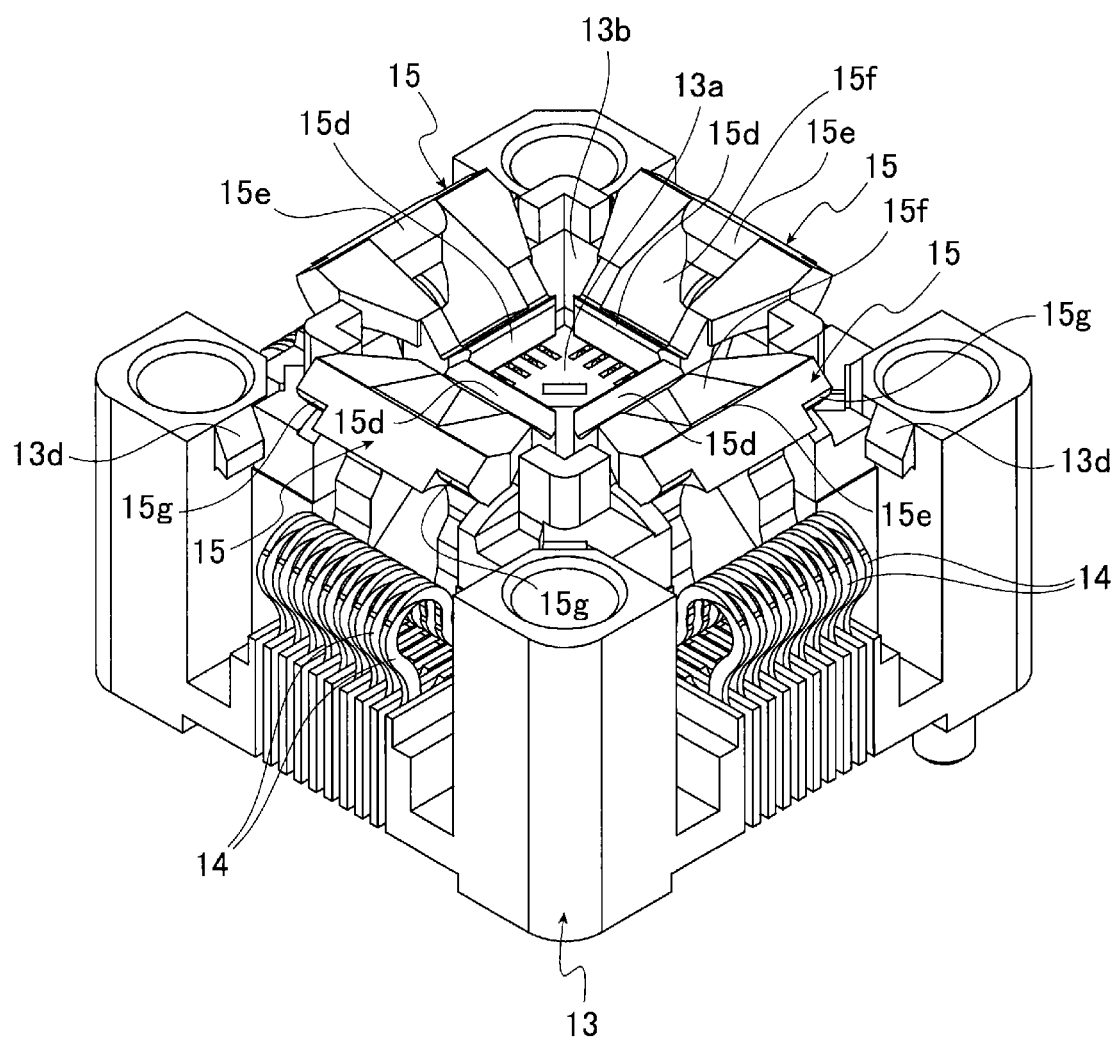
FIG. 7 is a perspective view of the IC socket showing a state in which the operating member of the IC socket according to the present embodiment is removed.

Still furthermore, as shown in FIG. 4, the operating member 16 is formed with a pair of operating portions 16e for closing, and when the operating member 16 is moved upward from the most lowering position, a pair of operation portions 15g to be operated for closing of the latch 15 is pressed upward to close the latch 15 by the pair of the operating portions 16e for closing. The operating portions 16e for closing are disposed on both sides of the arranged contact pins 14 and on the inside portion from the most outside portion 14e of the horseshoe-shaped contact pins 14 (see FIG. 2).

Incidentally, the IC socket 11 of the structure mentioned above is not provided with a floating plate which is provided in a conventional structure.

Hereunder, a method of using the IC socket 11 of the structure mentioned above will be explained.

In the following, there will be explained a case in which the IC package 12 is accommodated on the IC socket 11 in a state in which the IC socket 11 is preliminarily fixed to a circuit board.

First, when the operating member 16 is pressed downward against the urging force of the springs 17 from the states shown in right-half in FIG. 2 and FIG. 4, the operation portions 15e to be operated for opening of the latches 15 are pressed while sliding on the sliding surface 16c of the operating portion 16b for opening of the operating member 16, and the latches 15 are then rotated in the opening direction thereof with the rotation shafts 15a being the center of the rotation. According to this motion, the operating portion 16b for opening of the operating member 16 is deeply inserted into the opening portion 15f of the latch 15, and the pressing portion 15d of the latch 15 is retired from the accommodation/take-out range of the IC package 12 (see left-half side in FIG. 2).

As described above, since there is provided the operating member 16 having the operating portion 16b for opening for rotating the latch 15 in the opening direction thereof by pressing downward the operation portion 15e to be operated for opening formed to the central portion in the width direction of the latch 15, spaces on both the sides of the latch can be made narrow in comparison with a structure in which the latch is pressed downward by using spaces on both the sides of the latch 15, thus contributing realization of compact outer configuration of the IC socket 11.

Furthermore, the opening portion 15*f* is formed to the central portion of the latch 15, and when the operating portion 16*b* for opening of the operating member 16 is moved downward, the operating portion 16*b* is inserted into the opening portion 15*f* while pressing downward the operation portion 15*e* to be operated for opening formed to the rear side of the opening 15*f* of the latch 15. According to such structure, the operating member 16 is formed to be further on the inner side of the socket body 13, thus also realizing the compact outer configuration of the IC socket 11.

Still furthermore, as shown in FIG. 2, the operating portion 16*b* for opening of the operating member 16 is provided with the sliding surface 16*c*, formed linearly, pressing the operation portion 15*e* to be operated for opening of the latch 15 so as to slide on the sliding surface 16*c*. Accordingly, in comparison with the sliding surface 16*c* having a curved- or bent-shape, the outer configuration of the operating member can be further made compact with the desired amount of the rotating motion of the latch 15 being ensured.

Still furthermore, the latch 15 is formed with a pair of rotation shafts 15*a* on both the sides of the opening portion 15*f*, and in the most lowering position of the operating member 16, the front end portion of the operating portion 16*b* is inserted to a position of the opening portion 15*f* on the extension line of the rotation shaft 15*a*. According to such structure, the operating member 16 is provided to the position further on the inner side of the socket body 13, thus also making compact the outer configuration of the IC socket 11.

In the state in which the latch 15 is opened maximally, the front end portion of the operating portion 16*b* for opening of the operating member 16 is inserted into the opening portion 15*f* of the latch 15 deeply to a position on the extension axis line of the rotation shaft 15*a*, so that the front end surface 16*d* along the perpendicular direction of the operating portion 16*b* for opening almost abuts against the inclined surface portion 15*h* for escape of the latch 15. According to such setting, the outer configuration can be made extremely compact with the amount of rotational motion of the latch 15 being ensured (see left-half side in FIG. 2 and FIG. 5).

A most outside position 15*i* in a state where the latch 15 is maximally opened takes a position almost not projecting from the most outside portion 14*e* of the contact pin 14 as shown in the left-half side in FIG. 2, which is different from a conventional structure, and does not project largely outside. Accordingly, the outer configuration of the IC socket 11 can be extremely downsized, thus realizing a compact structure of the IC socket 11.

Furthermore, since the rotation center of the rotation shaft 15*a* of the latch 15 is positioned below the IC package accommodation surface portion 13*a* of the socket body 13, the stroke of the latch 15 to the accommodation surface portion 13*a* can be made longer, so that even if the rotating amount of the latch 15 is small, the IC package 12 can be pressed and/or released by the movement of the pressing portion 15*d*. Thus, the vertical stroke of the operating member 16 can be made short, and hence, the vertical stroke of the IC socket 11 can be made also short, thus making compact the structure of the operating member 16.

In addition, since the moving amount in the outside direction of the latch 15 can be shortened, the IC socket 11 can be made compact.

Incidentally, according to the rotation of the latch 15, the elastic piece 14*a* of the contact pin 14 is pressed by the cam portion 15*c* of the latch 15 and then elastically deformed downward. According to this pressing operation, the contact portion 14*b* of the contact pin 14 is displaced or urged downward.

Under the state mentioned above, the IC package 12 is delivered by an automatic machine. Then, the IC package is guided by the guide portions 13*b* of the socket body 13 and is accommodated to a predetermined position on the IC package accommodation surface portion 13*a* of the socket body 13 which is not provided with any floating plate.

Thereafter, when the external force, which has applied to the operating member 16, is released, the operating member 16 is moved upward by the urging force of the springs 17, and according to this upward motion of the operating member 16, the operation portions 15*g* to be operated for closing of the latches 15 are pushed upward by a pair of the operating portion 16*e* for closing positioned on both the sides of a plurality of the contact pins 14 and then, the latches 15 are rotated in the closing direction thereof.

As explained above, as shown in FIGS. 4 and 9, according to the structure in which the paired operation portions 15*g* for closing of the latches 15 are formed so as to project on both the sides of the alignment of the plural contact pins 14, and the paired operating portions 16*e* for closing of the operating member 16 are positioned on both the sides of the alignment of the contact pins 14, it becomes unnecessary to provide a pair of the operating portions 16*e* for closing of the operating member 16 outside the contact pins 14 (see right-half side in FIG. 2). Thus, in this viewpoint, the outer configuration of the operating member 16, i.e., socket body 13, can be also made compact.

On the other hand, when the latches 15 are rotated in the closing direction, the pressing force by the cam portions 15*c* of the latch 15 to the elastic pieces 14*a* of the contact pins 14 is released, the elastic pieces 14*a* are displaced upward by the elastic force, and the contact portions 14*b* then contact the terminals 12*b* of the IC package 12, respectively. According to such motion, the IC package 12 is moved slightly upward from the IC package accommodation surface portion 13*a* of the socket body 13 by the elastic force of the elastic pieces 14*a* (see FIG. 13).

Thereafter, the operating member 16 is moved further upward while the latches 15 being closed, and the upper surface of the IC package 12 is thereby pressed downward by the pressing portions 15*d* of the latches 15.

Figure 14:
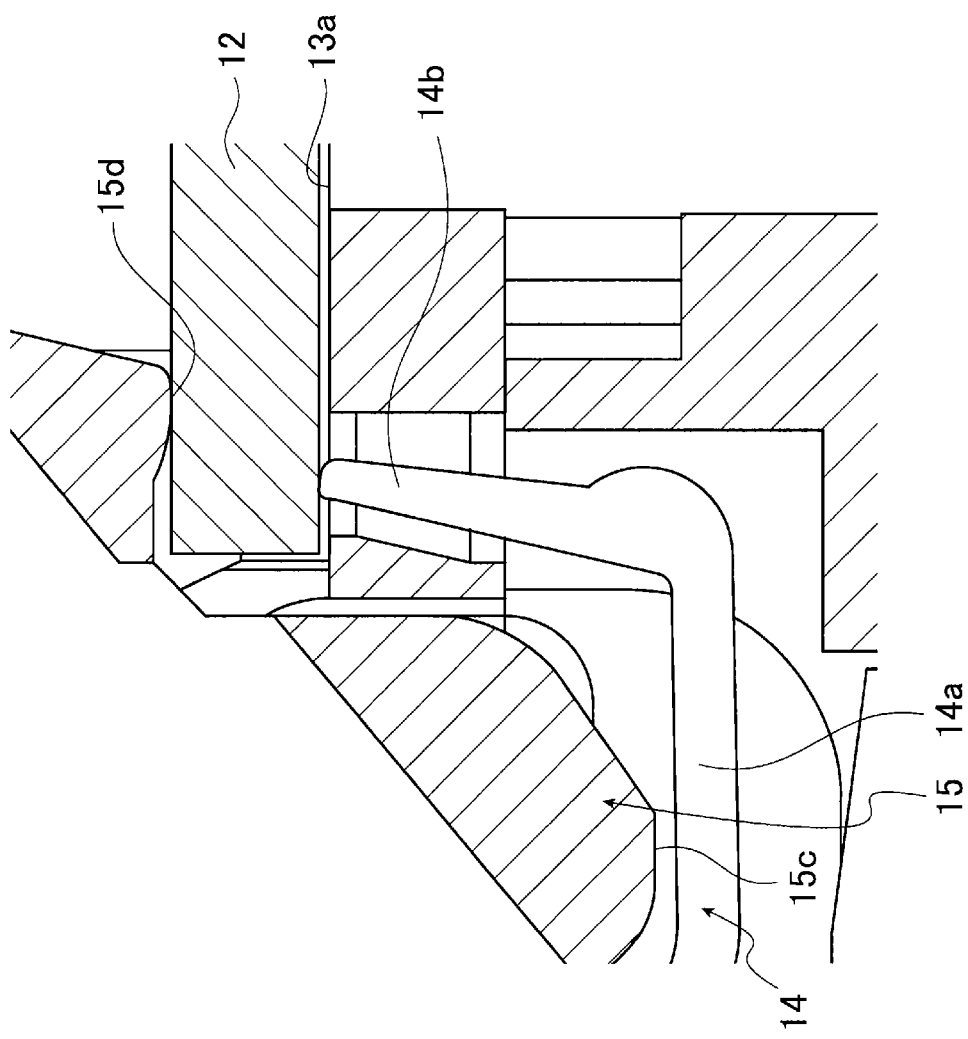
FIG. 14 is a sectional view, in an enlarged scale, showing a state in which the IC package is slightly pressed downward by the pressing force of the latch from the state according to the present embodiment shown in FIG. 13.

Then, as shown in FIG. 14, the IC package 12 is moved slightly downward against the urging force of the elastic pieces 14*a* of the contact pins 14.

According to such motion, the IC package 12 is electrically connected to the circuit board through the contact pin 14 so as to be ready for performing a burn-in test.

According to the configuration mentioned above, it becomes unnecessary to vertically move the seating surface (accommodation surface portion 13*a*) of the IC package 12 by the cam portion 15*c* of the latch 15. In addition, the elastic pieces 14*a* of the contact pins 14 is formed so as to elastically deformed. Therefore, it becomes unnecessary to locate any floating plate. Thus, the pushing amount of the IC package 12 by the pressing portion 15*d* of the latch 15 can be made small, and accordingly, a distance from the rotating center (pivot center) of the latch 15 to the pressing portion 15*d* thereof can be shortened, and the latch 15 can be hence made compact, resulting in realization of the compact IC socket 11.

Still furthermore, since becomes unnecessary to locate the floating plate, the number of parts to be arranged can be reduced. Accordingly, tolerance of each of parts or components can be made small. Additionally, vibrations in the lateral direction on a plane, which occurs in the case the floating plate is used, can be prevented. Thus, the IC package 12 can be arranged to a predetermined position more precisely.

As described above, when the IC package 12 is accommodated to the IC socket 11, the latches 15 are rotated in the direction to be opened, and so the elastic pieces 14a of the contact pins 14 move downward. After this, IC package is accommodated, then, the elastic pieces 14a moves upward so that the contact portions 14b contact with the terminals 12b of the IC package 12. Therefore, in comparison with the conventional art, the present embodiment can make each contact portion 14b contact with the terminal 12b at pinpoint contact and any wiping is hardly caused. Hence, according to the present embodiment, any wiping trail or trace is not almost caused to the terminal 12b of the IC package 12, and in addition, the contact portions 14b of the contact pins 14 are hard to come away even in a case of the IC package 12 having extremely narrow width.

In addition, any wiping trail or trace is not almost caused to the upper surface of the IC package 12 because any sliding is hardly caused when the latches 15 press the upper surface of the IC package 12.

Furthermore, as mentioned above, when a test of the IC package 12 finishes and the IC package 12 is picked up, the latches 15 are gradually opened and so the cam portions 15c of the latches 15 make the elastic pieces 14a of the contact pins 14 move downward. Consequently, the present embodiment can certainly prevent the contact portions 14b of the contact pins 14 from sticking with the terminals 12b of the IC package 12.

Moreover, since the latch has so-called a trapezoid shape having a front end side (inside) having a narrow width H1 and a rear end side (outside) having a wide width H2, and a center side (operation portion 15e to be operated for opening) is constructed for an opening portion, and both end sides (operation portions 15g to be operated for closing) are constructed for closing portions, it is not necessary to form or provide a structure for opening/closing the latch in a space on the rear side of the latch 15, thereby making further compact the entire outer configuration of the IC socket 11.

Still furthermore, since the clamping portions 14c of the contact pins 14 can be provided to be detachable to the mount portion 13c of the socket body 13 from the transverse side of the socket body 13, operation workings such as exchanging working can be extremely easily done.

Still furthermore, the operation portions 15e to be operated for opening of the latches 15 are arranged at the central portions in the width direction thereof so that these portions 15e are opened by the pressing of the operating portions 16b for opening of the operating member 16, and accordingly, the latches 15 can perform the opening and/or closing operation in a balanced state only by pressing one portion of the operating member 16.

Further, it is to be noted that in the above described embodiment, although the present invention is applied to the IC socket 11 as "socket for electric parts", the present invention is not limited to this application and is applicable to other devices and the like.

What is claimed is:

1. A socket for electric parts comprising:
 a socket body which has a rectangle shape and has an accommodation surface to accommodate an electric parts having a rectangle shape and a lower surface to which terminals are provided;
 plural contact pins of horseshoe-shapes, which are disposed in parallel and at predetermined intervals to a peripheral edge of the socket body, and each of which has an elastic piece to contact with the terminals of the electric part,
 a latch rotatably disposed on the socket body so as to positioned above the contact pins, which presses an upper part of peripheral portion of the electric part when the latch is closed and is in a state the electric part is able to be accommodated onto and taken out from the accommodation surface when the latch is opened,
 an operating member which is vertically movably disposed in the socket body, and comprises an operating portion for opening constituted so as to press down an operation portion to be operated for opening of the latch and rotate the latch in an opening direction when the operating member moves downward,
 wherein a most outside position of the latch is disposed on an inside of most outside portion of the contact pins when the latch is opened to an outermost position.

2. The socket for electric parts according to claim 1, wherein the most outside position of the latch is defined by the operation portion to be operated for opening.

3. The socket for electric parts according to claim 1, wherein the rotation shaft of the latch is positioned below the accommodation surface of the socket body.

4. The socket for electric parts according to claim 1, wherein the operation portion to be operated for opening formed at a rear end side of the latch has a surface which faces the contact pins and curves along the curved-shape of the contact pins.

\* \* \* \* \*